(12) United States Patent
Kartal et al.

(10) Patent No.: US 10,079,599 B2
(45) Date of Patent: Sep. 18, 2018

(54) CONTROLLING AT LEAST TWO TRANSISTORS

(71) Applicant: Infineon Technologies AG, Neubiberg (DE)

(72) Inventors: Veli Kartal, Munich (DE); Stephan Donath, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 4 days.

(21) Appl. No.: 15/294,059

(22) Filed: Oct. 14, 2016

(65) Prior Publication Data

US 2018/0109254 A1   Apr. 19, 2018

(51) Int. Cl.
*H03K 17/687* (2006.01)
*H02M 3/07* (2006.01)
*H03K 17/74* (2006.01)

(52) U.S. Cl.
CPC .......... *H03K 17/6871* (2013.01); *H02M 3/07* (2013.01); *H03K 17/74* (2013.01)

(58) Field of Classification Search
None
See application file for complete search history.

(56) References Cited

U.S. PATENT DOCUMENTS

| 6,744,297 | B2 * | 6/2004 | Huang ............. H03K 19/00361 327/324 |
| 2005/0200398 | A1 * | 9/2005 | Arai .................. H03K 17/0822 327/427 |
| 2015/0042401 | A1 * | 2/2015 | Knol ................ H03K 17/04123 327/543 |

* cited by examiner

*Primary Examiner* — Long Nguyen
(74) *Attorney, Agent, or Firm* — Shumaker & Sieffert, P.A.

(57) ABSTRACT

A device is suggested comprising at least two transistors, each of the transistors comprising a current path and a control terminal, wherein the current paths of the at least two transistors are arranged in parallel, wherein the control terminals of the at least two transistors are connected to a control node via at least one voltage drop component. Also, a method to efficiently control at least two transistors is provided.

10 Claims, 6 Drawing Sheets

CONTROLLING AT LEAST TWO TRANSISTORS

BACKGROUND OF THE INVENTION

Embodiments of the present disclosure relate to efficient switching of at least two transistors.

SUMMARY

A first embodiment relates to a device comprising at least two transistors, each of the transistors comprising a current path and a control terminal,
  wherein the current paths of the at least two transistors are arranged in parallel,
  wherein the control terminals of the at least two transistors are connected to a control node via at least one voltage drop component.

A second embodiment relates to a method for controlling at least two transistors, wherein each of the transistors comprises a current path and a control terminal, wherein the current paths of the at least two transistors are arranged in parallel, wherein the control terminals of the at least two transistors are connected to a control node via at least one voltage drop component, the method comprising:
  applying a control signal to the control node to sequentially switch the at least two transistors.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

There are many applications that utilize the effect of MOSFETs being arranged or connected in parallel to each other. It is also a motivation to control the MOSFETs such that not all MOSFETs switch (on or off) at the same time. At least two of the MOSFETs that are arranged in parallel may be controlled such that they switch (on or off) subsequently after each other.

This allows controlling the Miller plateau during the switching on duration or the switching off duration and it allows maintaining a safe operating area (SOA) of the MOSFETs.

However, in order to individually control the MOSFETs, the gates of the MOSFETs may have to be controlled differently.

For individually controlling several MOSFETs, a gate signal may be generated and supplied to the gate of each MOSFET. This may require a gate driver, a gate connection, a gate pin and a gate bonding wire for each of the MOSFETs. Additional components, however, result in additional space and hence lead to costs and further efforts.

According to an example provided herewith, a single gate signal can be used to control more than one MOSFET. Hence, in particular several MOSFETs that are arranged in parallel may be efficiently controlled via such gate signal. This approach allows reducing overall costs for the circuit. It is also an advantage that several MOSFETs that are arranged in parallel to each other can be implemented within a housing and/or an integrated circuit.

Figure 1:
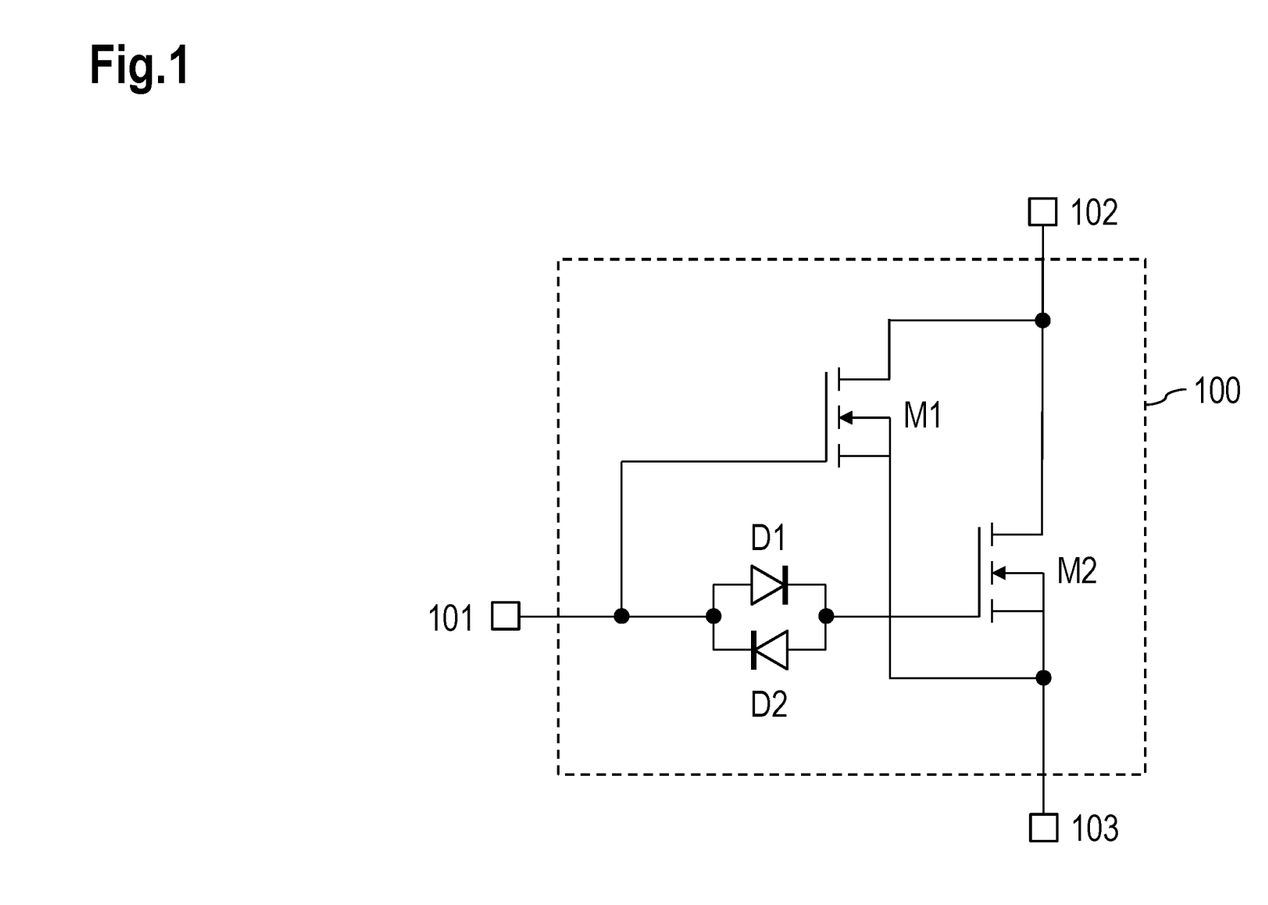
FIG. 1 shows an exemplary component comprising a gate terminal, a drain terminal and a source terminal that allows for sequentially switching two MOSFETs.

FIG. 1 shows an exemplary component 100 comprising a gate terminal 101, a drain terminal 102 and a source terminal 103.

The gate terminal 101 is connected via a diode D1 to the gate of a MOSFET M2, wherein the cathode of the diode D1 points towards the gate of the MOSFET M2. A diode D2 is arranged anti-parallel to the diode D1, i.e. the cathode of the diode D2 points towards the gate terminal 101.

The gate terminal 101 is connected to the gate of a MOSFET M1. The drain of the MOSFET M1 is connected to the drain terminal 102 and the source of the MOSFET M1 is connected to the source terminal 103. The drain of the MOSFET M2 is connected to the drain terminal 102 and the source of the MOSFET M2 is connected to the source terminal 103.

The diodes D1 and D2, which are arranged antiparallel to each other lead to a voltage difference amounting to 0.7V at the gate of MOSFET M2 compared to the potential at the gate of the MOSFET M1. Hence, a voltage applied to the gate terminal 101 allows controlling a two-staged on-switching: First of the MOSFET M1 and, after an increase of 0.7V, an on-switching of the MOSFET M2.

Figure 3:
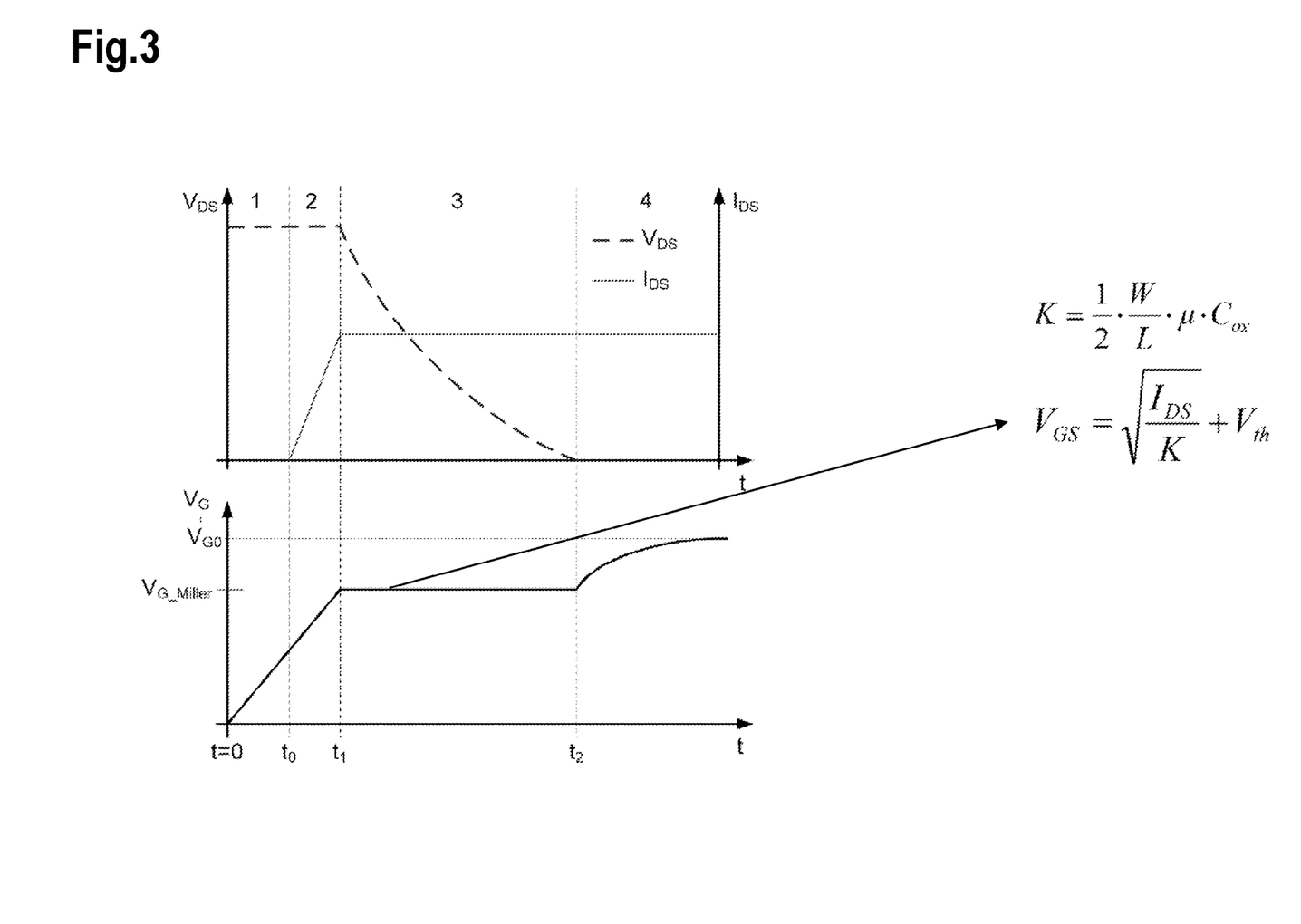
FIG. 3 shows diagrams visualizing the switching-on characteristics of a MOSFET, in particular the Miller plateau.

FIG. 3 shows diagrams visualizing the switching-on characteristics of a MOSFET, in particular the Miller plateau. If the gate of the MOSFET is charged by a current source, the gate-source voltage of the MOSFET substantially remains on the so-called Miller plateau $$V_{G\_Miller} = V_{GS} = \sqrt{\frac{I_{DS}}{K}} + V_{th}$$

with $$K = \frac{1}{2} \cdot \frac{W}{L} \cdot \mu \cdot C_{ox}$$

wherein
  $I_{DS}$ is the Drain-Source current,
  $V_{th}$ is the threshold voltage of the MOSFET, W is the width of the channel of the MOSFET,
L is the length of the channel of the MOSFET,
μ is the electrical mobility [m$^2$/(Vs)],
$C_{ox}$ is the Oxide Capacitance, and
K is a single MOSFET device parameter [A/V$^2$].

Hence, in a first phase between t=0 and t=t$_1$, the MOSFET is not yet activated, because the gate-source capacity of the MOSFET needs to be charged until the threshold voltage $V_{G\_Miller}$ is reached. When the threshold voltage $V_{G\_Miller}$ is reached, the drain-source path gets activated and the drain-source capacitance is discharged. This results in an equilibrium also referred to as Miller plateau. The Miller plateau exists for a limited amount of time, i.e. until t=t$_2$ in the example of FIG. 3.

The voltage drop between the gates of the MOSFET M1 and the MOSFET M2 results in a voltage $V_{G1}$ at the gate of the MOSFET M1 being at a voltage above the threshold voltage $V_{threshold}$ and a voltage $V_{G2}$ at the gate of the MOSFET M2 being at a voltage below the threshold voltage $V_{threshold}$, i.e.

$$V_{G1} > V_{threshold} > V_{G2}.$$

This results in the MOSFET M2 remaining switched off and the MOSFET M1 is switched on. By further increasing the voltage applied to the gate terminal 101, the voltage $V_{G2}$ at the gate of the MOSFET M2 is further increased above the threshold voltage $V_{threshold}$, i.e.

$$V_{G1} > V_{G2} > V_{threshold}$$

and the MOSFET M2 is also switched on.

It is noted that this effect applies for sequentially switching off the MOSFETs M1 and M2 accordingly, i.e. reducing the voltage at the gate terminal 101
   such that the voltage $V_{G2}$ is below the threshold voltage $V_{threshold}$ leads to the MOSFET M2 being switched off; and further such that the voltage $V_{G1}$ is below the threshold voltage $V_{threshold}$ leads to also the MOSFET M1 being switched off.

It is further noted that the exemplary arrangement shown in FIG. 1 can be applied to more than two MOSFETs. The anti-parallel diodes D1 and D2 provide a voltage drop at the gate of the MOSFET M2 compared to the MOSFET M1. The anti-parallel diodes D1 and D2 are one exemplary arrangement to achieve such voltage drop. Any other voltage drop component could be used. Further, more than one voltage drop component can be provided in the path between the gate terminal 101 and the gate of the respective MOSFET (in FIG. 1: M1 and/or M2). Hence, a multitude of k MOSFETs can be arranged in parallel as shown in FIG. 1, wherein at least k−1 MOSFETs are connected via such at least one voltage drop component with the gate terminal 101. In other words, one control path (between the gate terminal 101 and the gate of the respective MOSFET) may not have a voltage drop component and all the other k−1 control paths have voltage drop components in particular providing a different voltage drop for each of the control paths.

Figure 2:
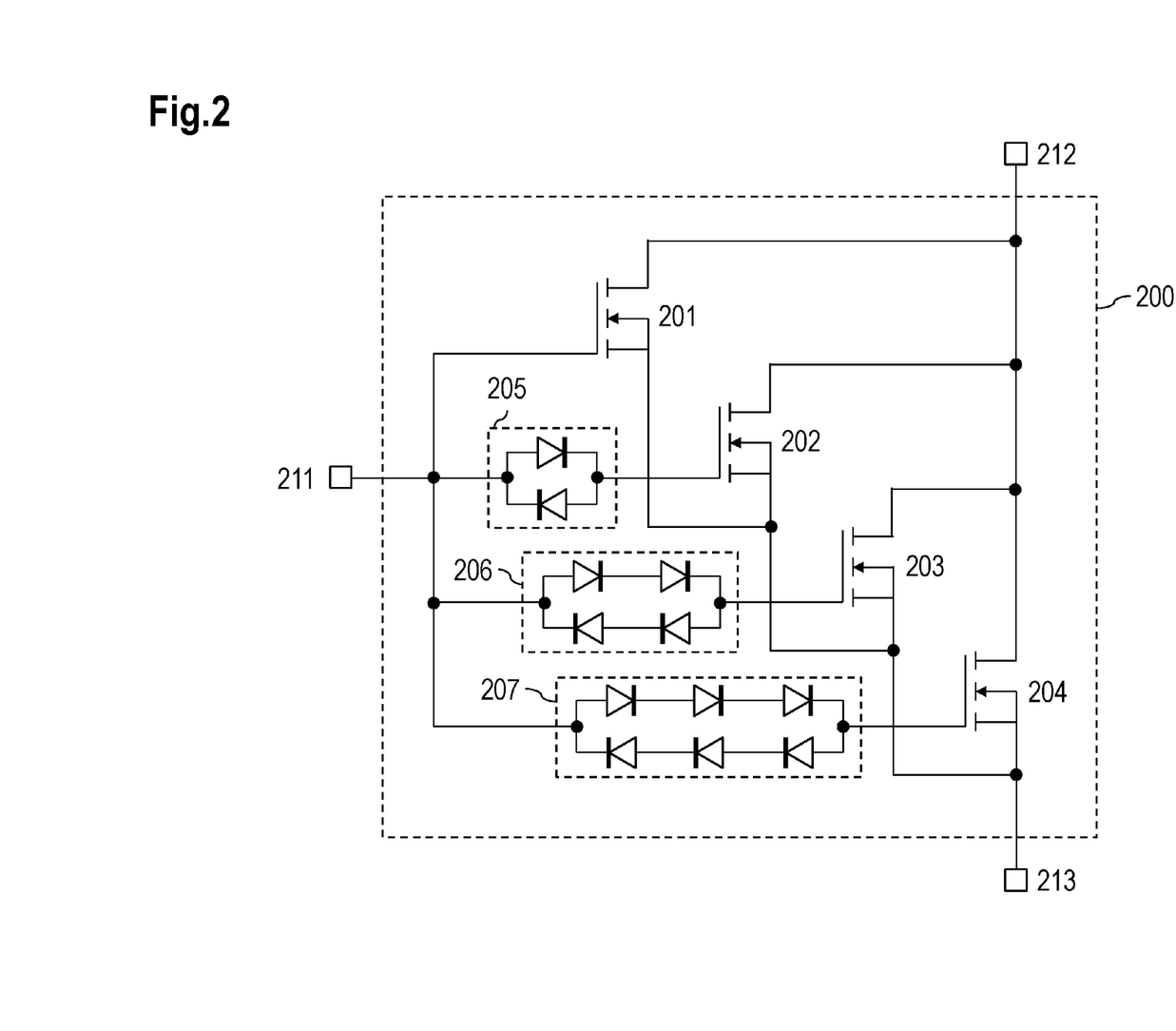
FIG. 2 shows an exemplary component comprising four MOSFETs, which are arranged in parallel and are subsequently controlled via a single control signal applied to a gate terminal of the component.

FIG. 2 shows an exemplary component 200 comprising four MOSFETs 201 to 204, which are arranged in parallel. As shown and explained with regard to FIG. 1, the MOSFETs are connected to a gate terminal 211, a drain terminal 212 and a source terminal 213. Each of the gates of the MOSFETs 202 to 204 is connected to the gate terminal 211 via a voltage drop component 205 to 207.

The voltage drop component 205 may comprise two antiparallel diodes as shown in FIG. 1. The voltage drop component 206 may comprise a series connection of two diodes with the same orientation to which an anti-parallel series connection of two diodes is arranged, thereby providing a voltage drop amounting to 2*0,7V=1.4V. Accordingly, the voltage drop component 207 may comprise a series connection of three diodes with the same orientation to which an anti-parallel series connection of three diodes is arranged, thereby providing a voltage drop amounting to 3*0,7V=2.1V.

This allows for an individual multi-stage control of the MOSFETs 201 to 204.

The voltage drop component may also be regarded as a delay component: when a voltage is supplied to the delay component, the MOSFET using this delay component is switched on after an additional amount of voltage is supplied. If the voltage is supplied at a predetermined increase rate, this results in a time delay depending on the actual voltage drop determined by the voltage drop component, i.e. the voltage that is "consumed" by the voltage drop component before the gate of the MOSFET reaches its threshold voltage $V_{threshold}$.

It is noted that the voltage drop component may use at least one of the following elements: a diode, a polymer diode, a Zener diode, a Schottky diode, a resistor or any circuitry that lead to a voltage drop.

It is also an option that instead of MOSFETs, various types of transistors can be used; for example, an IGBT, a Super Junction MOSFET (MOS gated device). It is noted that the gate may also be referred to as base of a transistor, the drain may also be referred to as collector and the source may also be referred to as emitter (e.g., of a transistor).

It is a further option that an active area on the silicon for the MOSFETs may vary; i.e. the MOSFET M1 and the MOSFET M2 have active areas of different sizes. It is an option that the active area of the MOSFETs M1 and M2 is arranged in an intermeshed structure. If one of the MOSFETs has a large active area, the MOSFET with the small active area may use this large active area for heat dissipation purposes. This is beneficial, because providing a heat dissipation possibility allows maintaining the linear mode of the MOSFET with the small active area.

Figure 4:
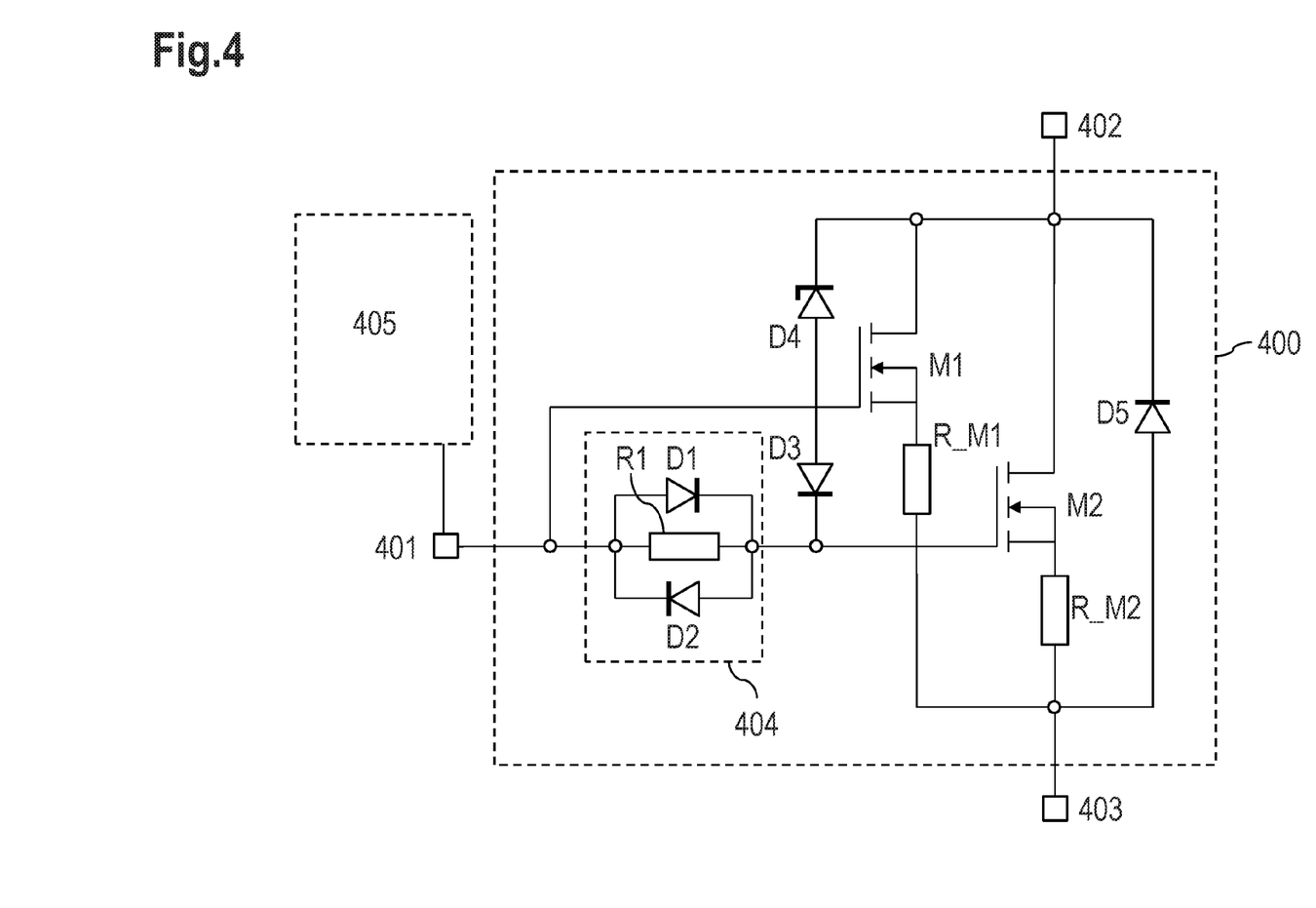
FIG. 4 an alternative circuit diagram based on the circuitry shown in FIG. 1, which in particular supports a dynamic mode that only activates the MOSFET M2, a static mode that only activates the MOSFETs M1 and M2 and a static mode that activates both MOSFETs M1 and M2.

FIG. 4 shows an alternative circuit diagram based on the circuitry shown in FIG. 1. The arrangement 400 of FIG. 4 comprises a gate terminal 401, a drain terminal 402 and a source terminal 403 and it can be used to replace an electronic switch, e.g., a MOSFET.

The gate terminal 401 is connected via a diode D1 to the gate of a MOSFET M2, wherein the cathode of the diode D1 points towards the gate of the MOSFET M2. A diode D2 is arranged anti-parallel to the diode D1, i.e. the cathode of the diode D2 points towards the gate terminal 101. Also, a resistor R1 is arranged in parallel to the diode D1.

The gate terminal 401 is connected to the gate of a MOSFET M1. The drain of the MOSFET M1 is connected to the drain terminal 402 and the source of the MOSFET M1 is connected via a resistor R_M1 to the source terminal 403. The drain of the MOSFET M2 is connected to the drain terminal 402 and the source of the MOSFET M2 is connected via a resistor R_M2 to the source terminal 403. The resistors R_M1 and R_M2 may each have a resistance amounting to 1 MOhm. It is noted that the resistors R_M1 and R_M2 can be used to measure a current, but may also be omitted.

A diode D5 is arranged between the drain terminal 402 and the source terminal 403, wherein the cathode of the diode D5 points towards the drain terminal 402. The diode D5 symbolizes the body diode of the MOSFETs M1 and M2.

The drain terminal 402 is connected via a series connection of a Zener diode D4 and a diode D3 to the gate of the MOSFET M2, wherein the cathode of the Zener diode D4 points towards the drain terminal 402 and the cathode of the diode D3 points towards the gate of the MOSFET M2.

The diode D1, the diode D2 and the resistor R1 can be perceived as a component 404. This component lies in the path between the gate terminal 401 and the gate of the MOSFET M2 and allows the MOSFET M2 to be controlled differently to the MOSFET M1, which is also driven by the signal applied to the gate terminal 401.

As both MOSFETs M1 and M2 are controlled via the gate terminal 401 by a driver circuit 405, a dynamic mode and a static mode may be distinguished.

In the dynamic mode, the MOSFET M1 may remain switched off while the MOSFET M2 is (periodically) switched on, which results in no current ($I_{DS\_M1}$: drain source current) passing the MOSFET M1 and a current $I_{DS\_M2}$ different from zero passing the MOSFET M2. In this mode, an on-off-signal is applied to the gate terminal 401 running at a frequency that allows the component 404 in combination with the internal (gate-source) capacity of the MOSET M2 to act as a charge pump. The amplitude of the signal applied to the gate 401 is below the voltage that would activate the MOSFET M1; due to the charge pump characteristics contributed by the component 404, the MOSFET M2 is repeatedly switched on and off (driven in a clocked mode due to the frequency of the signal applied to the gate terminal 401), which results in a current $I_{DS\_M2}$ passing the MOSFET M2.

In the static mode, a voltage larger than the threshold voltage of both MOSFETs M1 and M2 is applied at the gate terminal 401, which results in both MOSFETs M1 and M2 being activated.

Also, there is a static mode (not shown with regard to FIG. 4) that allows switching on only the MOSFET M1, if the signal applied to the gate terminal 401 is above the threshold for activating the gate of the MOSFET M1 and below the threshold for activating the gate of the MOSFET M2. This is feasible because of the voltage drop across the component 404.

Figure 5:
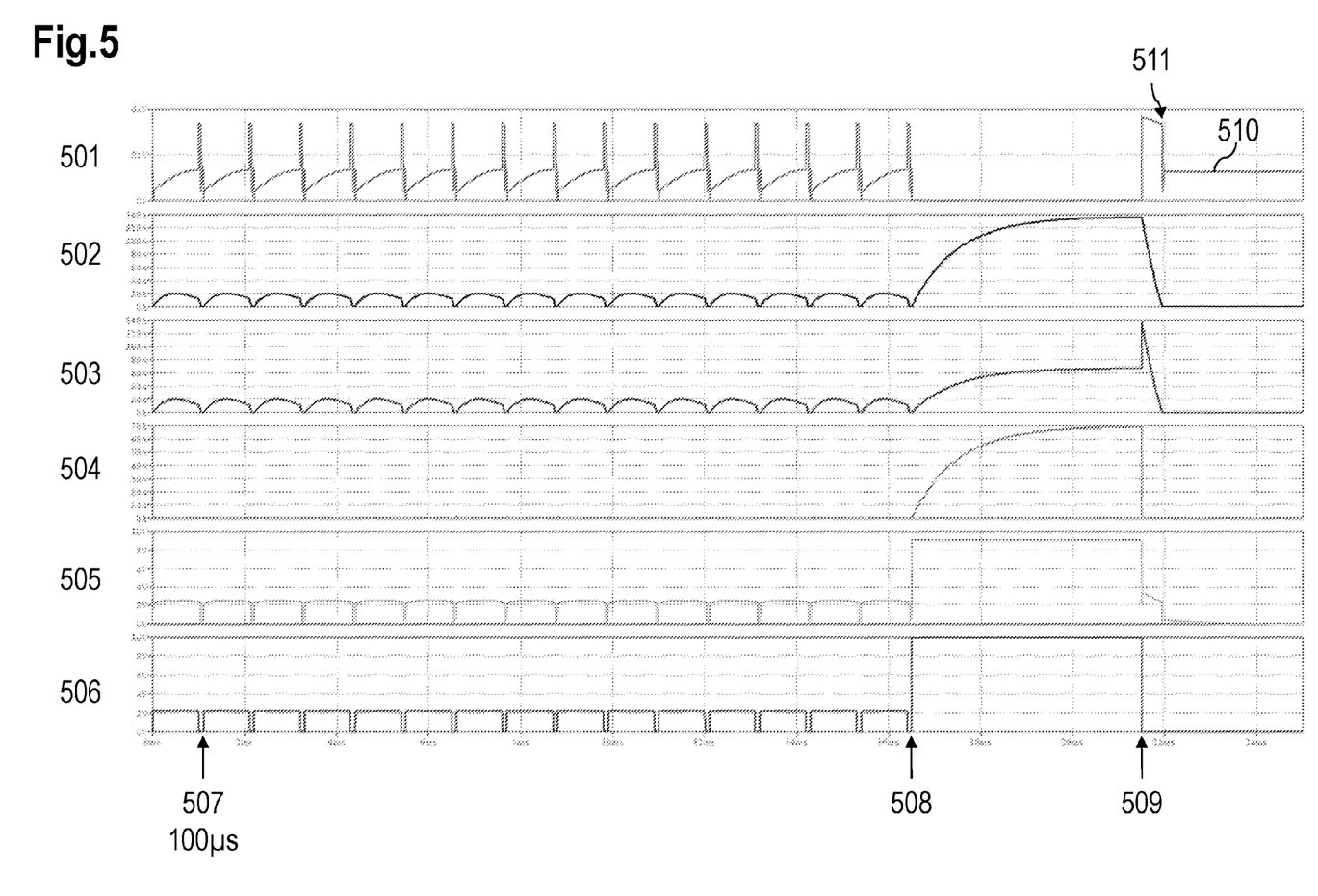
FIG. 5 shows signal diagrams of voltages and currents in the circuitry of FIG. 4, wherein in a dynamic mode the gate terminal is controlled at least partially with an oscillating signal with an off-duration amounting to 100 µs.
Figure 6:
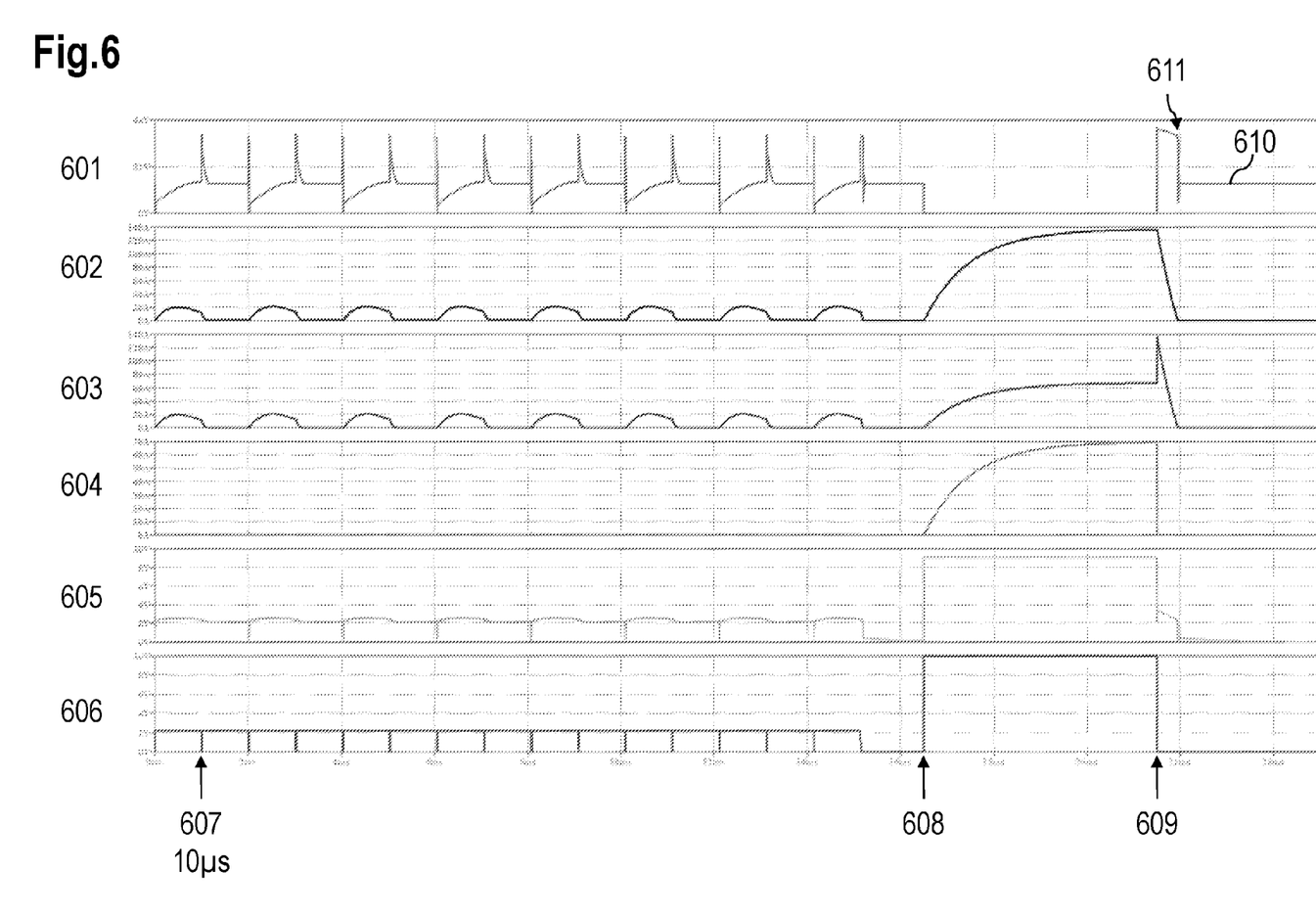
FIG. 6 shows signal diagrams of voltages and currents in the circuitry of FIG. 4, wherein in a dynamic mode the gate terminal is controlled at least partially with an oscillating signal with an off-duration amounting to 10 µs.

FIG. 5 and FIG. 6 show signal diagrams of voltages and currents in the circuitry of FIG. 4. The following signals are shown:
- a curve 501, 601 shows a voltage at the drain terminal 402;
- a curve 502, 602 shows a combined drain-source current passing the MOSFETs M1 and M2, i.e. $I_{DS\_M1}+I_{DS\_M2}$;
- a curve 503, 603 shows the drain-source current $I_{DS\_M2}$ passing the MOSFET M2;
- a curve 504, 604 shows the drain-source current $I_{DS\_M1}$ passing the MOSFET M1;
- a curve 505, 605 shows a gate-source voltage $V_{GS\_M1}$ at the MOSFET M1 and
- a curve 506, 606 shows a gate source voltage $V_{GS\_M2}$ at the MOSFET M2, which also equals the voltage at the gate terminal 401.

FIG. 5 shows an off-duration 507 amounting to 100 µs and FIG. 6 shows an off-duration 607 amounting to 10 µs.

The x-axis in FIG. 5 and FIG. 6 depicts the time. From 0 ms the gate terminal 401 is controlled with an oscillating signal
with an on-time of 1 ms and an off-time of 0.1 ms in FIG. 5 and
with an on-time of 1 ms and an off-time of 0.01 ms in FIG. 6, wherein the amplitude during the on-time is just under the threshold voltage for activating the MOSFET, i.e. (in this example) under 2.17V.

The off-time triggers re-charging the gate of the MOSFET M2 via the component 404. If the off-time of the clocked signal amounts to 100 µs as shown in FIG. 5, the gate-source voltage $V_{GS\_M2}$ 505 at the MOSFET M2 is only shortly interrupted, but substantially remains at a voltage that is marginally above the threshold voltage of 2.17V and allows the MOSFET M2 to be activated resulting in a pulsating current $I_{DS\_M2}$ 503.

If the off-time of the clocked signal amounts to 10 µs as shown in FIG. 6, the gate-source voltage $V_{GS\_M2}$ 605 at the MOSFET M2 is only shortly interrupted, which allows the gate-source voltage $V_{GS\_M2}$ 605 to fall below the threshold voltage for activating the MOSFET M2. Hence, every second interruption amounting to 10 µs the charge pump comprising the component 404 and the gate-source capacitance of the MOSFET M2 supplies enough charge to the gate of the MOSFET M2 to become activated, which—as shown in FIG. 6, curve 603—results in the current $I_{DS\_M2}$.

It is noted that the drain terminal 402 may be connected to a battery that provides a battery voltage level 510, 610 in case the MOSFETs M1, M2 are switched off.

The diode D4 is a Zener diode with a predefined avalanche breakdown that allows the current to flow via the Zener diode D4, the diode D3 and the diode D2. The point of the avalanche breakdown is exemplarily shown in FIG. 5 and FIG. 6 as reference 511, 611.

At a time 508, 608 the signal applied to the gate terminal 401 is changed to a stationary on-state with an amplitude amounting to 10V. At a time 509, 609 the signal applied to the gate terminal 401 is switched off (i.e. to 0V). During this stationary on-state the MOSFETs M1 and M2 are activated, wherein the curve 505, 605 shows an amplitude reduced by 0.7V compared to the curve 506, 606, which is based on the voltage drop across the diode D1.

The examples suggested herein may in particular be based on at least one of the following solutions. In particular combinations of the following features could be utilized in order to reach a desired result. The features of the method could be combined with any feature(s) of the device, apparatus or system or vice versa.

A device is provided comprising at least two transistors, each of the transistors comprising a current path and a control terminal,
wherein the current paths of the at least two transistors are arranged in parallel,
wherein the control terminals of the at least two transistors are connected to a control node via at least one voltage drop component.

It is noted that the transistor may be a MOS gated device, an IGBT comprising gate, collector emitter or a bipolar transistor comprising base, collector and emitter or a MOSFET comprising gate, drain and source. Accordingly, the current path of a transistor is the path
from the drain to the source or vice versa or
from the collector to the emitter or vice versa.

The "current paths arranged in parallel" means that the drains of the transistors may be connected with each other and the sources of the transistors may be connected with each other (directly or indirectly, e.g., via resistors). It is also noted that, e.g., resistors may be part of the current paths of the at least two transistors; in such case, a current path may comprise such resistor. The current path indicates in particular a load current flowing through the drain source path or the collector emitter path (and optionally another electronic component like, e.g., said resistor).

The control terminal of the transistor is either the gate or the base of the transistor.

Hence, a control path from the control terminal of each of the transistors to the control node may comprise at least one voltage drop component or it may not comprise any voltage drop component. If there are several control paths connecting the control terminals of several transistors to the control node, one control path may not have a voltage drop component and the other control paths may comprise (at least one) voltage drop component. It is in particular an option that each control paths results in a different voltage drop between the signal applied to the control node and the signal arriving at the control terminal of the respective transistors. This may be achieved by different voltage drop components or by arranging several voltage drop components in series. As indicated, one control path may lack such voltage drop component which then would result in (substantially) no voltage drop of this control path.

The voltage drop component may vary for each such control path, i.e. not the same voltage drop component may be provided for the control paths between the control terminals of the transistors and the control node. This may thus result in different amounts of voltage drops for each of the control paths.

In an embodiment, the control terminal of at least one of the at least two transistors is directly connected to the control node without a voltage drop component.

In an embodiment, the control terminals of the at least two transistors are connected to the control node via the at least one voltage drop component such that different voltage drops apply for control paths between the control node and the control terminal of the at least two transistors.

In an embodiment, the voltage drop component comprises at least one of the following components:
- a diode,
- a resistor,
- a Schottky diode,
- a polymer diode,
- a Zener diode,
- a series connection of at least one diode.

In an embodiment, the voltage drop component comprises:
- a first series connection comprising at least one first diode, wherein the at least one first diode is arranged in a first orientation and
- a second series connection comprising at least one second diode, wherein the at least one second diode is arranged in a second orientation,
- wherein the first series connection and the second series connection are arranged in parallel and
- wherein the first orientation and the second orientation are anti-parallel to each other.

Hence, the first diodes and the second diodes are arranged such that the cathodes of the first diodes point towards the opposite direction as the cathodes of the second diodes. It is noted that the number of first diodes and the number of second diodes may differ or they may be the same. It is also noted that additional elements like, at least one resistor, may be provided with each of the first series connection and/or the second series connection.

In an embodiment, the voltage drop component further comprises:
- at least one resistor is arranged in parallel to the first series connection and to the second series connection.

Hence, at least one resistor may be arranged within the (at least one) voltage drop component. The at least one resistor may be arranged in parallel to the first and second series connection.

In one particular embodiment, the voltage drop component comprises two antiparallel diodes which are arranged in parallel to each other and in parallel to at least one resistor. Each of the diodes may be replaced by more than two diodes for different voltage drop components.

In an embodiment, the device further comprises a driving circuit for driving the at least two transistors via the control node,
- wherein in a dynamic mode an oscillating signal is applied to the control node, and
- wherein in a static mode a static signal is applied to the control node.

The oscillating signal may be any type of clocked signal. It may oscillate between two states or it may comprise many states, e.g., repeating patterns or waveforms. The oscillating signal may have an amplitude close to a threshold voltage for activating the transistor. The transistor that is connected to the control node via the voltage drop component may thus become activated due to a charge pump characteristics of the voltage drop component and the capacitance of the transistor, which allows the oscillating signal to increase the load at its control terminal such that the transistor (temporarily) gets activated.

The same oscillating signal may be applied to a control terminal of a transistor that is connected to the control node without any intermediate voltage drop component. As the amplitude of the oscillating signal is below the activation voltage of the transistor and as there is no voltage drop component exploiting any charge pump characteristics, this transistor remains switched off.

Hence, in the dynamic mode, the transistor that is connected to the control node via the voltage drop component is (temporarily) activated, whereas the transistor that is connected to the control node without voltage drop component remains switched off.

In the static mode (steady-state), however, due to the voltage drop across the voltage drop component, the transistor that is connected to the control node without voltage drop component can be switched on while the transistor that is connected to the control node via the voltage drop component remains switched off.

Also in the static mode, the voltage applied to the control node may be high enough for the transistor that is connected to the control node without voltage drop component and for the transistor that is connected to the control node via the voltage drop component to become activated.

The above is an exemplary use case: The voltage drop component in this example is used to provide a voltage drop and it contributes as a charge pump (depending on the mode of operation, i.e. the type of signal applied to the control node). It is noted that a voltage drop component may be provided that does not contribute to a significant voltage drop and/or does not be dimensioned to become part of a significant charge pump. This may depend on dimensioning the circuitry. In this context "no voltage drop component" means that one path to one transistor has a voltage drop component which contributes to voltage drop/charge pump characteristics as explained above and the other path to the other transistor is different from this voltage drop/charge pump characteristics. It may very well be that the other path comprises some voltage drop component that has different thresholds and/or different charge pump characteristics, but it would then be controlled differently (e.g., with different amplitudes and/or frequencies of the oscillating signal or steady signal applied to the control node). This allows controlling the transistors separately via one control node. The signal applied to this control node allows activation of either one of the transistors separately or together.

It is also an option that more than two transistors are controlled via one control node. In such scenario, groups of transistors may be activated (and deactivated) via the signal that is applied to the common control node.

In an embodiment, in the dynamic mode at least one voltage drop component together with a capacity of the transistor that has its control terminal connected to the control node via the voltage drop component acts as a charge pump to at least temporarily activate this transistor.

In an embodiment, the device is arranged on a single die, as an integrated circuit and/or in a single housing.

Also, a method for controlling at least two transistors is suggested, wherein each of the transistors comprises a current path and a control terminal, wherein the current paths of the at least two transistors are arranged in parallel, wherein the control terminals of the at least two transistors are connected to a control node via at least one voltage drop component, the method comprising:
   applying a control signal to the control node to sequentially switch the at least two transistors.

The control signal may be a voltage applied to the control node to subsequently switch one after the other transistor on or off. The voltage may therefore be increased or decreased. Based on the at least one voltage drop component, the switching-on thresholds (as well as the switching-off thresholds) between the at least two transistors are shifted so that different amounts of voltage applied to the control node allows for a multi-staged switching-on (and off) of the transistors this (single) control node.

It is noted that the features described with regard to the device above can be applied to the method as well.

In an embodiment, the control signal is a voltage applied to the control node, wherein the control signal is a multi-staged voltage signal that is varied over time to subsequently switch the at least two transistors.

In an embodiment, the voltage drop component comprises:
   a first series connection comprising at least one first diode, wherein the at least one first diode is arranged in a first orientation and
   a second series connection comprising at least one second diode, wherein the at least one second diode is arranged in a second orientation,
   at least one resistor,
   wherein the first series connection and the second series connection and the at least one resistor are arranged in parallel and
   wherein the first orientation and the second orientation are anti-parallel to each other.

In embodiment, the method further comprises:
   in a dynamic mode applying an oscillating signal to the control node, and
   in a static mode applying a static signal to the control node.

In an embodiment, in the dynamic mode at least one voltage drop component together with a capacity of the transistor that has its control terminal connected to the control node via the voltage drop component acts as a charge pump to at least temporarily activate this transistor.

The following examples demonstrate one or more aspects of this disclosure and may be combined in any way.

EXAMPLE 1

A device comprising at least two transistors, each of the transistors comprising a current path and a control terminal,
   wherein the current paths of the at least two transistors are arranged in parallel,
   wherein the control terminals of the at least two transistors are connected to a control node via at least one voltage drop component.

EXAMPLE 2

The device according to example 1, wherein the control terminal of at least one of the at least two transistors is directly connected to the control node without a voltage drop component.

EXAMPLE 3

The device according any of examples 1 or 2 or combinations thereof, wherein the control terminals of the at least two transistors are connected to the control node via the at least one voltage drop component such that different voltage drops apply for control paths between the control node and the control terminal of the at least two transistors.

EXAMPLE 4

The device according to any of examples 1-3 or combinations thereof, wherein the voltage drop component comprises at least one of the following components:
   a diode,
   a resistor,
   a Schottky diode,
   a polymer diode,
   a Zener diode,
   a series connection of at least one diode.

EXAMPLE 5

The device according to any of examples 1-4 or combination thereof, wherein the voltage drop component comprises:
   a first series connection comprising at least one first diode, wherein the at least one first diode is arranged in a first orientation and
   a second series connection comprising at least one second diode, wherein the at least one second diode is arranged in a second orientation,
   wherein the first series connection and the second series connection are arranged in parallel and
   wherein the first orientation and the second orientation are anti-parallel to each other.

EXAMPLE 6

The device according to claim 5, wherein the voltage drop component further comprises:
   at least one resistor is arranged in parallel to the first series connection and to the second series connection.

EXAMPLE 7

The device according to any of examples 1-6 or combinations thereof, comprising a driving circuit for driving the at least two transistors via the control node, wherein in a dynamic mode an oscillating signal is applied to the control node, and wherein in a static mode a static signal is applied to the control node.

EXAMPLE 8

The device according to any of examples 1-7 or combination thereof, wherein in the dynamic mode at least one voltage drop component together with a capacity of the transistor that has its control terminal connected to the control node via the voltage drop component acts as a charge pump to at least temporarily activate this transistor.

EXAMPLE 9

The device according to any of examples 1-8 or combination thereof, wherein the device is arranged on a single die, as an integrated circuit and/or in a single housing.

EXAMPLE 10

A method for controlling at least two transistors, wherein each of the transistors comprises a current path and a control terminal, wherein the current paths of the at least two transistors are arranged in parallel, wherein the control terminals of the at least two transistors are connected to a control node via at least one voltage drop component, the method comprising:

applying a control signal to the control node to sequentially switch the at least two transistors.

EXAMPLE 11

The method according to example 10, wherein the control signal is a voltage applied to the control node, wherein the control signal is a multi-staged voltage signal that is varied over time to subsequently switch the at least two transistors.

EXAMPLE 12

The method according to any of examples 10 or 11 or combinations thereof, wherein the voltage drop component comprises:
a first series connection comprising at least one first diode, wherein the at least one first diode is arranged in a first orientation and
a second series connection comprising at least one second diode, wherein the at least one second diode is arranged in a second orientation,
at least one resistor,
wherein the first series connection and the second series connection and the at least one resistor are arranged in parallel and
wherein the first orientation and the second orientation are anti-parallel to each other.

EXAMPLE 13

The method according to any of examples 10-12 or combination thereof comprising:
in a dynamic mode applying an oscillating signal to the control node, and
in a static mode applying a static signal to the control node.

EXAMPLE 14

The method according to example 13, wherein in the dynamic mode at least one voltage drop component together with a capacity of the transistor that has its control terminal connected to the control node via the voltage drop component acts as a charge pump to at least temporarily activate this transistor.

Although various exemplary embodiments have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A device comprising at least two transistors, each of the at least two transistors comprising a current path and a control terminal,
wherein the current paths of the at least two transistors are arranged in parallel,
wherein the control terminal of each of the at least two transistors is connected to a control node either directly or via at least one voltage drop component,
wherein the control terminal of at least one of the at least two transistors is connected to the control node via the at least one voltage drop component,
wherein the at least one voltage drop component comprises:
a first series connection comprising at least one first diode, wherein the at least one first diode is arranged in a first orientation, and
a second series connection comprising at least one second diode, wherein the at least one second diode is arranged in a second orientation,
wherein the first series connection and the second series connection are arranged in parallel, and
wherein the first orientation and the second orientation are anti-parallel to each other,
at least one resistor is arranged in parallel to the first series connection and to the second series connection.

2. The device according to claim 1, wherein the control terminals of the at least two transistors are connected to the control node via the at least one voltage drop component such that different voltage drops apply for control paths between the control node and the control terminal of each of the at least two transistors.

3. The device according to claim 1, wherein the at least one voltage drop component comprises at least one of the following components:
a diode,
a resistor,
a Schottky diode,
a polymer diode,
a Zener diode,
a series connection of at least one diode.

4. The device according to claim 1, comprising a driving circuit for driving the at least two transistors via the control node,
wherein in a dynamic mode an oscillating signal is applied to the control node, and wherein in a static mode a static signal is applied to the control node.

5. The device according to claim 4, wherein in the dynamic mode at least one voltage drop component together with a capacity of one of the at least two transistors that has its control terminal connected to the control node via the at least one voltage drop component acts as a charge pump to at least temporarily activate this transistor.

6. The device according to claim 1, wherein the device is arranged on a single die, as an integrated circuit and/or in a single housing.

7. A method for controlling at least two transistors, wherein each of the at least two transistors comprises a current path and a control terminal, wherein the current paths of the at least two transistors are arranged in parallel, wherein the control terminal of each of the at least two transistors is connected to a control node directly or via at least one voltage drop component, wherein the control terminal of at least one of the at least two transistors is connected to the control node via the at least one voltage drop component, the method comprising:

applying a control signal to the control node to sequentially switch the at least two transistors, wherein the at least one voltage drop component comprises:

a first series connection comprising at least one first diode, wherein the at least one first diode is arranged in a first orientation, a second series connection comprising at least one second diode, wherein the at least one second diode is arranged in a second orientation, and at least one resistor, wherein the first series connection and the second series connection and the at least one resistor are arranged in parallel, and wherein the first orientation and the second orientation are anti-parallel to each other.

8. The method according to claim 7, wherein the control signal is a voltage applied to the control node, wherein the control signal is a multi-staged voltage signal that is varied over time to subsequently switch the at least two transistors.

9. The method according to claim 7, the method further comprising:

in a dynamic mode applying an oscillating signal to the control node, and in a static mode applying a static signal to the control node.

10. The method according to claim 9, wherein in the dynamic mode at least one voltage drop component together with a capacity of one of the at least two transistors that has its control terminal connected to the control node via the voltage drop component acts as a charge pump to at least temporarily activate this transistor.

* * * * *